United States Patent
Lam et al.

(10) Patent No.: US 7,505,739 B2
(45) Date of Patent: Mar. 17, 2009

(54) AUTOMATIC MODE SETTING AND POWER RAMP COMPENSATOR FOR SYSTEM POWER ON CONDITIONS

(75) Inventors: Kwai-Kwong K. Lam, Rancho Santa Margarita, CA (US); Christopher Rudolph Leon, Irvine, CA (US); Rabih Makarem, Irvine, CA (US)

(73) Assignee: Atheros Technology Ltd., Santa Clara, CA (US)

( * ) Notice: Subject to any disclaimer, the term of this patent is extended or adjusted under 35 U.S.C. 154(b) by 485 days.

(21) Appl. No.: 11/271,342

(22) Filed: Nov. 10, 2005

(65) Prior Publication Data

US 2006/0114014 A1   Jun. 1, 2006

Related U.S. Application Data

(60) Provisional application No. 60/627,595, filed on Nov. 12, 2004.

(51) Int. Cl.
   *H04B 17/00* (2006.01)
(52) U.S. Cl. ............... 455/67.11; 455/67.14; 455/226.1; 324/357.03; 714/733
(58) Field of Classification Search .............. 455/67.11, 455/67.14, 226.1; 324/357.03, 436; 714/733
   See application file for complete search history.

(56) References Cited

U.S. PATENT DOCUMENTS

| | | | | |
|---|---|---|---|---|
| 4,160,936 A | * | 7/1979 | Monroe ..................... | 315/388 |
| 4,800,577 A | * | 1/1989 | Tachita et al. ............... | 375/340 |
| 5,504,684 A | | 4/1996 | Lau et al. | |
| 5,767,732 A | | 6/1998 | Lee et al. | |
| 5,963,167 A | * | 10/1999 | Lichten et al. ......... | 342/357.06 |
| 5,987,990 A | * | 11/1999 | Worthington et al. ......... | 73/592 |
| 6,295,021 B1 | * | 9/2001 | Lichten et al. ............... | 342/355 |
| 6,411,098 B1 | * | 6/2002 | Laletin ....................... | 324/436 |
| 6,526,322 B1 | | 2/2003 | Peng et al. | |
| 6,560,442 B1 | * | 5/2003 | Yost et al. .................... | 455/423 |
| 6,771,212 B1 | * | 8/2004 | Yee et al. ............... | 342/357.06 |
| 6,911,644 B2 | * | 6/2005 | Doh et al. ............. | 250/214 AG |
| 6,950,665 B2 | * | 9/2005 | Swift et al. ................. | 455/501 |
| 7,068,052 B2 | * | 6/2006 | Hilleary et al. ............. | 324/700 |
| 7,091,904 B2 | * | 8/2006 | Vantalon et al. ........ | 342/357.03 |
| 2001/0015653 A1 | | 8/2001 | De Jong et al. | |
| 2003/0194001 A1 | * | 10/2003 | Barksdale, Jr. ............... | 375/229 |
| 2003/0206021 A1 | * | 11/2003 | Laletin et al. ............... | 324/426 |
| 2005/0193302 A1 | * | 9/2005 | Arguelles et al. ........... | 714/733 |

* cited by examiner

*Primary Examiner*—Minh D Dao
(74) *Attorney, Agent, or Firm*—Gates & Cooper LLP

(57) ABSTRACT

A GPS receiver with automatic mode-setting and power ramping circuitry is disclosed. AGPS receiver in accordance with the present invention comprises a first switch network, comprising a plurality of transistors, a first plurality of circuit components, coupled to the first switch network, wherein the switch network selects paths through the circuit components to generate a Power On Signal (POS) and ramp power to the GPS receiver, a plurality of test points, coupled to circuitry within the GPS receiver, wherein the test points are used to test intermediate stages of output of the GPS receiver, a second plurality of circuit components, each circuit component coupled to a corresponding test point in a respective manner, wherein the circuit components create outputs used in initialization of the GPS receiver, and a second switch network, coupled between the circuitry in the GPS receiver and the plurality of test points, for selectively switching the plurality of test points from being used to test intermediate stages of output of the GPS receiver and creating outputs used in initialization.

14 Claims, 3 Drawing Sheets

AUTOMATIC MODE SETTING AND POWER RAMP COMPENSATOR FOR SYSTEM POWER ON CONDITIONS

CROSS-REFERENCE TO RELATED APPLICATIONS

This application claims the benefit under 35 U.S.C. Section 119(e) of co-pending and commonly-assigned U.S. provisional patent application, Ser. No. 60/627,595, filed Nov. 12, 2004, entitled "RF CHIP FOR GLOBAL POSITIONING SYSTEM RECEIVER," by Lloyd Jian-Le Jiang et al., which application is incorporated by reference herein.

BACKGROUND OF THE INVENTION

1. Field of the Invention

The present invention relates generally to Global Positioning System (GPS) receivers, and in particular, to an automatic mode setting and power ramp compensator for system power on conditions in GPS receivers.

2. Description of the Related Art

The use of GPS in consumer products has become commonplace. Hand-held devices used for mountaineering, automobile navigation systems, and GPS for use with cellular telephones are just a few examples of consumer products using GPS technology.

As GPS technology is being combined with these devices, the GPS chips are being placed in widely ranging applications. Some of these applications require that the GPS chip be made smaller, or more efficient, presenting challenges to GPS receiver chip designers. Many of the functions of GPS chips are now being pushed to the edges of performance capabilities.

One of these functions is the ability to separate a GPS signal from background noise. Noise is often interpreted as a component of the GPS signal, and, as such, creates problems with position determination and accuracy of the GPS functionality. As GPS chips are placed in lower signal strength environments, and GPS chips are designed to be placed in smaller and smaller devices, the ability of a GPS receiver to separate signal from noise becomes more important.

It can be seen, then, that there is a need in the art to provide GPS chips with increased ability to separate noise from desired GPS signals.

SUMMARY OF THE INVENTION

To minimize the limitations in the prior art, and to minimize other limitations that will become apparent upon reading and understanding the present specification, the present invention discloses an automatic mode setting and power ramp compensator for system power on conditions.

A mode-setting device in accordance with the present invention comprises a plurality of test points, coupled to circuitry within the GPS receiver, wherein the test points are used to test intermediate stages of output of the GPS receiver, a plurality of circuit components, each circuit component coupled to a corresponding test point in a respective manner, wherein the circuit components create outputs used in initialization of the GPS receiver, and a switch network, coupled between the circuitry in the GPS receiver and the plurality of test points, for selectively switching the plurality of test points from being used to test intermediate stages of output of the GPS receiver and creating outputs used in initialization.

Such a device optionally further includes the circuit components being resistors, the outputs used in initialization being logic level outputs, the logic level outputs being used to select a mode of the GPS receiver during power up of the GPS receiver, the selective switching of the test points is based on a presence of a Power On Signal (POS), and further based on a presence of an enable signal.

A Power On Signal (POS) generating device in accordance with the present invention comprises a switch network, comprising a plurality of transistors, and a plurality of capacitors, coupled to the switch network, wherein the switch network selectively charges each capacitor in a predetermined manner, wherein the predetermined manner is selected based on a quality of a power supply used to power up the circuit and POS signal is generated after the power supply has settled at a desired voltage value.

Such a device further optionally includes the device being used in a Global Positioning System (GPS) receiver, the POS device further generating a delayed POS signal, the device uses a fractional part of the power supply output to begin generation of the POS signal and the delayed POS signal, a mode-setting device for initializing the GPS receiver, the mode-setting device comprising a plurality of test points, coupled to circuitry within the GPS receiver, wherein the test points are used to test intermediate stages of output of the GPS receiver; a plurality of circuit components, each circuit component coupled to a corresponding test point in a respective manner, wherein the circuit components create outputs used in initialization of the GPS receiver; and a second switch network, coupled between the circuitry in the GPS receiver and the plurality of test points, for selectively switching the plurality of test points from being used to test intermediate stages of output of the GPS receiver and creating outputs used in initialization, and the POS device being resident on the GPS receiver chip.

A GPS receiver with mode-setting and power ramping circuitry in accordance with the present invention comprises a first switch network, comprising a plurality of transistors, a first plurality of circuit components, coupled to the first switch network, wherein the switch network selects paths through the circuit components to generate a Power On Signal (POS) and ramp power to the GPS receiver, a plurality of test points, coupled to circuitry within the GPS receiver, wherein the test points are used to test intermediate stages of output of the GPS receiver, a second plurality of circuit components, each circuit component coupled to a corresponding test point in a respective manner, wherein the circuit components create outputs used in initialization of the GPS receiver, and a second switch network, coupled between the circuitry in the GPS receiver and the plurality of test points, for selectively switching the plurality of test points from being used to test intermediate stages of output of the GPS receiver and creating outputs used in initialization.

Such a GPS receiver further optionally includes the first plurality of circuit components being a plurality of capacitors, and the second plurality of circuit components being a plurality of resistors.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
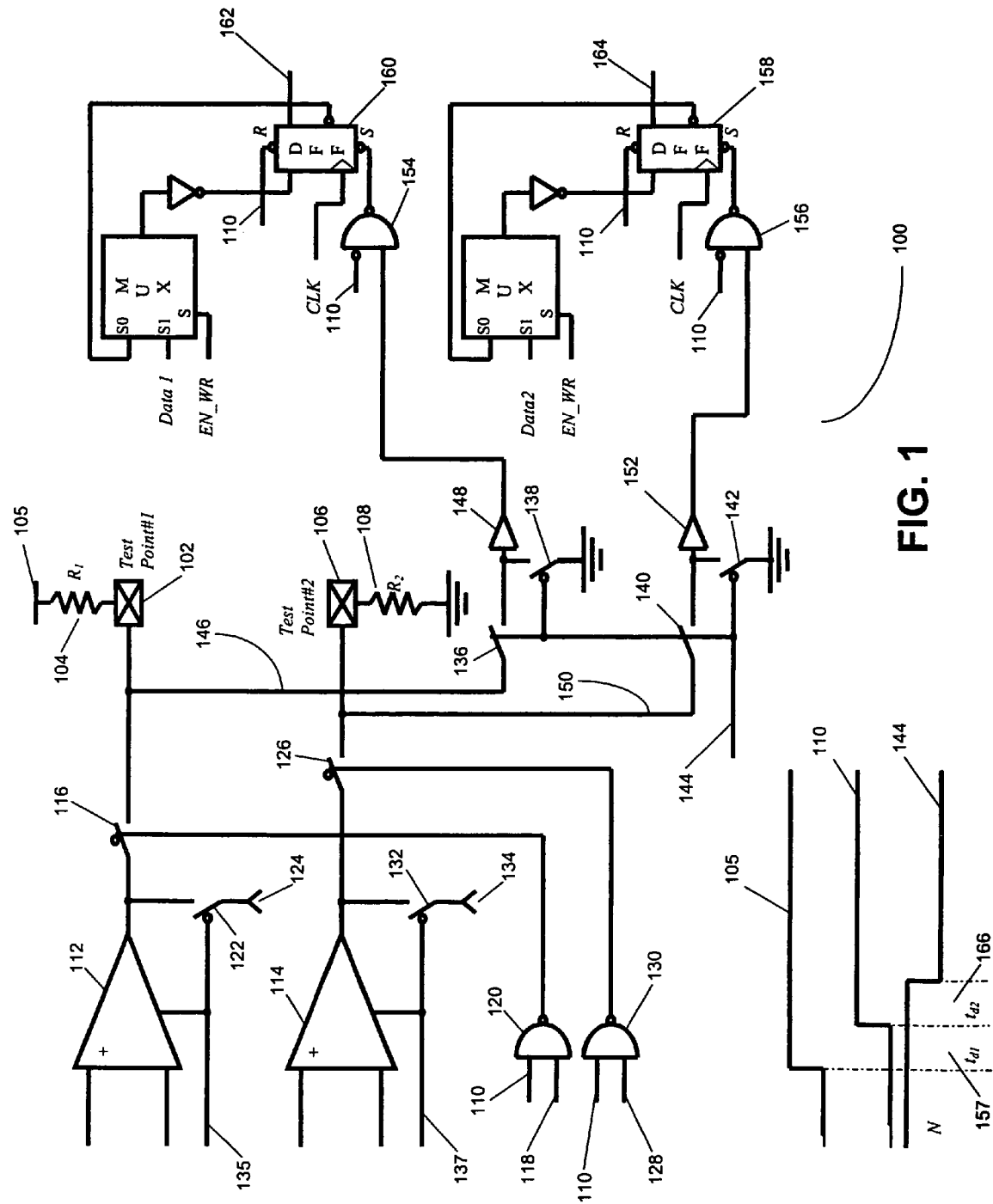
FIG. 1 illustrates an embodiment of the test pin reuse feature of the present invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Typically, GPS receivers comprise a Radio Frequency (RF) section (also called a GPS front end) and a baseband section, where the RF section is on one Integrated Circuit (IC) chip and the baseband section is on a separate IC chip. After the IC chips are manufactured, they are tested using test points, also called "pins," that allow for probing and testing of the chip at various locations. The test pins are designed to be used only for testing. Such an approach increases the "pin count" of the chip, which increases the packaging cost of the chip and mounting area in assembly.

The present invention contemplates using the test pins for more than just testing; the test pins can also be coupled to specific points within the RF section, at least in one instance, to assist in the start-up (power up) mode selection for the RF chip. The present invention can also be used with other areas within the RF chip, or in the baseband IC chip, or other IC chips, to decrease pin count while still providing full capability of the overall IC chip functions.

A GPS RF chip typically has four basic operational modes that are set and chosen with two mode-select bits per a given Temperature Controlled Crystal Oscillator (TCXO) frequency. Typically, four separate devices are used to control these select bits during power up of the GPS RF front end. The present invention uses the test pins and minor additional circuitry to perform the mode select function, and, thus, the development of four separate devices is not required. These mode-setting bits, which are typically implemented with either bond options or external dedicated pins, configure the device to a particular operation. Additional bond locations entails additional inventory cost issues, while additional external test pins creates form factor issues in a small form factor design.

The GPS RF frontend must be robust to generate an LO frequency for a mixer to perform down conversion of the RF signal and derive a reference/master clock for the baseband digital device. These clock sources must be accurate upon powering up a GPS receiver system because the clock validity/frequency is important for the signal processing functions. System issues could occur if one has to start the RF device to a default mode first and then program the mode select bits again to the desired mode. For example, if the TCXO frequency of the desired mode is not the same as the "default" operating mode, a lockup condition can occur which may prevent the baseband section from communicating with the RF section.

The present invention minimized or eliminates the lockup condition, and prevents unnecessary mode switching during power up of the GPS system. Using this invention, the configuration process of a GPS receiver device becomes transparent to the users such that the operation of the device does not experience any frequency change or glitch. By reusing the analog test monitoring pins as inputs, the GPS front end of the present invention has a smaller pin count and allows for small package size or form factor.

Test Pin Reuse

FIG. 1 illustrates an embodiment of the test pin reuse feature of the present invention.

System 100 is shown, and is typically a part of an RF section of a GPS receiver, but can be part of any circuit that goes through a power-on reset scenario. Test point 102, with resistor 104 tied to a supply voltage 105, which is typically referred to as Vdd, and test point 106, with resistor 108 tied to ground, are connected to the circuitry shown in system 100. Power-On Signal (POS) 110 that is normally at logic 1 after power up is shown at various places in system 100. Resistors 104 and 108 are added to system 100 for the re-use of test points as described hereinbelow.

Test points 102 and 106 typically receive signals from test amplifiers 112 and 114, respectively, which signals are outputs that are applied selectively to test points 102 and 106 in the system 100. These test amplifiers are used to monitor output signals of the intermediate stages of the RF section in a GPS receiver. So, when switch 116 is closed for testing, which occurs when POS signal 110 and a test enable signal 118 are both applied to gate 120, the output of the activated amplifier 112 is directed towards test point 102. When test point 102 has completed the testing requirements via amplifier 112, amplifier 112 can be deactivated or disabled by a signal on line 135. The same signal enables switch 122 and provides port 124 an access to test point 102. Port 124 is the output of a switch network that monitors other important signals in the RF section. After completing all testing, switch 116 is opened by removing the enable signal 118. Test point 102 is thus not directly driven by any test output. Similarly, when switch 126 is closed, which occurs when POS signal 110 and an enable signal 128 are both applied to gate 130, the output of amplifier 114 is directed towards test point 106. When test point 106 has completed the testing requirements via amplifier 114, amplifier 114 can be disabled by signal 137. This signal enables switch 132 and provides port 134 an access to test point 106. After completing all testing, switch 126 is opened by removing the enable signal 128. Test point 106 is not directly driven by any test output.

In a normal GPS operation, the test points 102 and 106 are not being driven. They are activated only during device testing. Without the enable signals 118 and 128, gates 120 and 130 will never close switches 116 and 126 respectively, so test points 102 and 106 are removed from the outputs of test amplifiers 112 and 114. Ports 124 and 134 are removed from the test points as well.

Switches 136, 138, 140, and 142 are controlled by signal 144, an inverted version of the delayed POS. These switches are complementary and are drawn accordingly. Switches 136 and 140 are enabled when signal 144 is asserted with a logic 1 while the other two switches are enabled when signal 144 is asserted with a logic 0. When signal 144 is applied with a logic 1 to switches 136 and 140, the switches close, which applies signal 146 to logic buffer 148 and signal 150 to logic buffer 152. Signal 146 is a logic high, and signal 150 is a logic low in system 100. Signal 146, after buffering, is then gated with POS signal 110 at gate 154; similarly, signal 150 is gated with POR signal 110 at gate 156.

Upon power up, POS signal 110, which is generated internally by system 100 (or another system), is transitioning from a logic low (also called a logic 0) to a logic high (also called a logic 1). The initial logic 0 of the POS signal 110 disables the analog test circuitry because of gates 120 and 130. Test points 102 and 106 are not driven by the test circuitry. The logic states of the test points 102 and 106, which are defined by the specific connections of the resistors 104 and 108 respectively, are evaluated. Namely, signals 146 and 150 are evaluated and sampled by the internal circuitry, and finally latched into the mode-setting register flip-flops.

Upon power up, the automatic mode-setting mechanism starts and completes in duration td1 157 in which power is just applied to the system and POS 110 is still at a logic 0 and is transitioning to a logic 1. The POS signal 110 resets both flip-flops 158 and 160 via the R port that is active low. The buffered versions of signals 146 and 150 are gated with POS signal 110. The outputs of gates 154 and 156 feed the S port of the flip-flops 158 and 160 respectively. In system 100, the S port of the flip-flops 158 and 160 has a higher priority than the R port. Thus MODE_b2 signal 162 is a logic 1 while MODE_b1 signal 164 is a logic 0. The logic states of these mode bits 162 and 164 match up with the desired setting at test points 102 and 106 respectively, after the mode-setting process is completed when POS signal 110 is high. Switches 136 and 140 are disabled by signal 144 to release test points 102 and 106 for analog tests. Switches 138 and 142 are used to define the logic states of logic buffers 148 and 152 to logic 0 such that no floating nodes exist. Duration td2 166 is used to meet the hold time requirement of the flip-flops 158 and 160 and setup for a break-before-make switching in the mode-setting process.

The programming of the mode setting bits is complete at this point and latches or flip-flops hold their states. A user can then remove the external resistors 104 and 108 and their connection, and enable the test enable bits and test signal select bits, and perform the desired test measurements. The states of these mode select bits can be changed again only with another power up event, or a serial port over-ride supported by the GPS frontend of the present invention. The serial port over-ride process for mode setting has its own drawbacks and is supported with the added MUX and inverter plus a few signals. The process is initiated and enabled by the signal EN_WR. The desired mode bits are Data1 and Data2 respectively and they will be at the outputs of the corresponding flip-flops at the rising edge of CLK. In a normal operation, the desired mode bit is maintained with the logic loop consisting of the flip-flop, the MUX, and the inverter.

As can be seen from FIG. 1, any number of test points 102 and 106 can be used to provide inputs to various parts of the circuit. Specifically, any number of test points 102 and 106 can be used to provide power-up conditions to a GPS receiver, in the RF section or the baseband section, or both. Further, although resistors 104 and 108 are shown, other circuit components, such as capacitors, inductors, diodes, transistors, or other devices can be coupled to test points 102 and 106 without departing from the scope of the present invention.

Low Power, Power Ramp Compensated Power On Signal Generator

The "Power On Signal (POS)," signal 110 shown in FIG. 1 informs the circuitry of system 100, as well as other circuitry in the GPS receiver, that the power supply has been applied to the power rail and that the circuitry can process signal or data correctly.

Figure 2A:
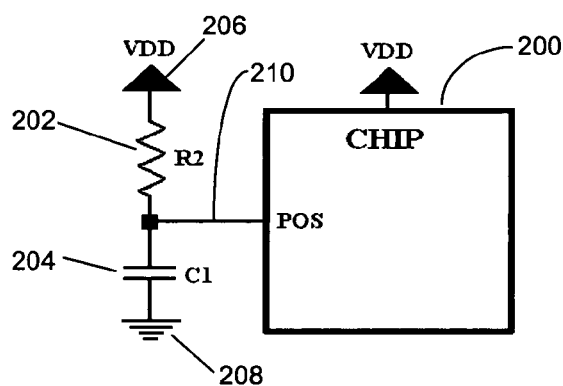
FIGS. 2A-2B illustrate related art approaches to the POS signal generation.
Figure 2B:
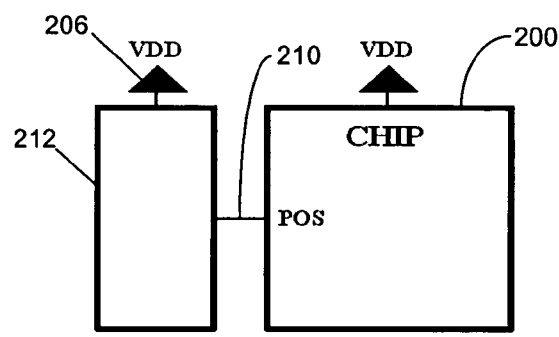

FIGS. 2A-2B illustrate related art approaches to the POS signal generation. Typically, as shown in FIG. 2A, GPS receiver 200 uses an external resistor 202 and capacitor 204, where resistor 202 is tied to the power supply voltage Vdd 206 and capacitor 204 is tied to ground 208, such that the voltage at point 210, which is the POS signal, slowly ramps up to a voltage based on the RC time constant. Signal 210 is typically used on other portions of GPS receiver 200, or is also sometimes used to provide a POS signal 210 to other portions of the device that GPS receiver 100 is resident in.

A related approach shown in FIG. 2B provides a dedicated POS signal 210 to GPS receiver 200 from a dedicated POS generator 212. Rather than having a common POS signal 210 as shown in FIG. 2A, dedicated POS generator 212 is an external component or components that only provides POS signal 210 to GPS receiver 200, and to no other circuitry. However, there is still an extra device, namely POS signal generator 212, that must be integrated with the GPS receiver 200.

Figure 2C:
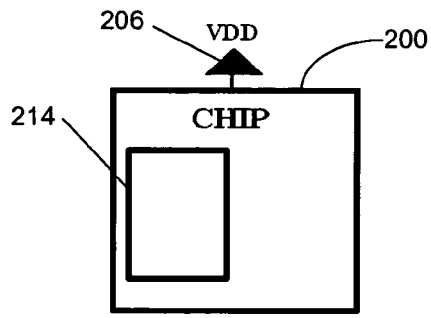
FIG. 2C shows the POS schema of the present invention.

FIG. 2C shows the POS schema of the present invention. Since GPS receiver 200 must be connected to power supply voltage Vdd 206 anyway, the present invention contemplates providing the POS generator 214 as part of the GPS receiver 200, rather than an external component.

Figure 3:
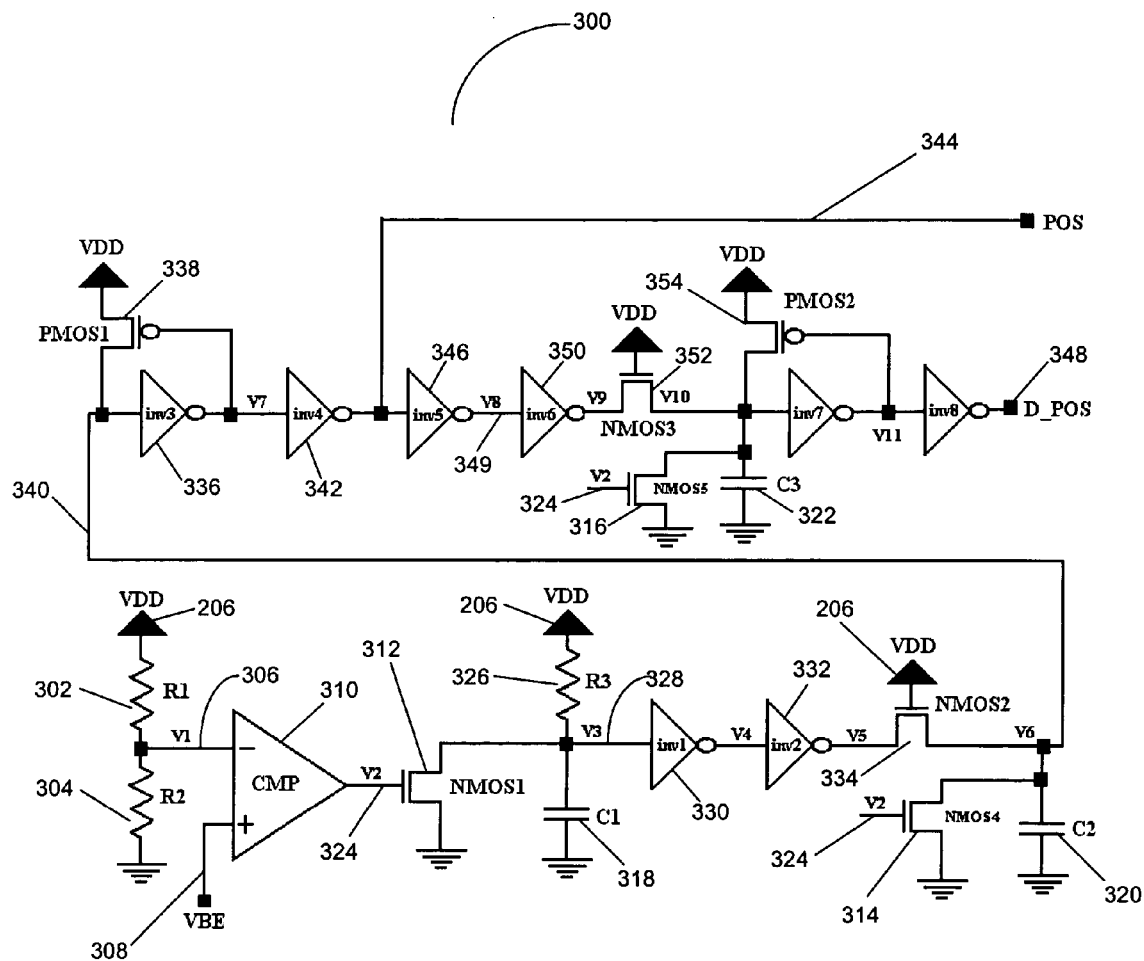
FIG. 3 illustrates a schematic implementing an embodiment of the POS signal generator of the present invention.

FIG. 3 illustrates a schematic implementing an embodiment of the POS signal generator of the present invention.

Circuit 300 is shown, with a voltage divider comprising resistors 302 and 304 to generate a linear voltage V1 306. Voltage 306 is compared to a voltage 308 with a non-linear characteristic at comparator 310. By selection the values of resistors 302 and 304, and voltage 308, the POS signal can be delayed until a desired voltage level is present at the power supply voltage Vdd 206. This desired voltage is typically 75% of the final value of voltage Vdd 206, because internal bandgaps and biasing circuitry is typically enabled by that point in time, but can be other values if desired. Voltage 308 is typically generated by the base-emitter voltage across a bipolar junction transistor as in a bandgap circuit, but can be generated in other manners if desired.

Upon power up, comparator 310 initially keeps the transistors NMOS1 312, NMOS4 314, and NMOS5 316 in an on state, which keeps capacitors C1 318, C2 320, and C3 322 discharged until the voltage 306 reaches the value of voltage 308 (the base-emitter voltage). Once equality is reached between voltage 306 and 308, transistors 312, 314, and 316 receive a zero-voltage condition, signal V2 324 on their gates, which disables transistors 312, 314, and 316, and begins charging the capacitors 318, 320, and 322.

When voltage 324 reaches a low enough voltage to turn transistor 312 off, supply voltage 206 begins charging capacitor 318 through resistor 326. When voltage 328, which is at the node between resistor 326 and capacitor 318 reaches the threshold voltage to trigger inverter 330, and then inverter 332 after a gate delay. This creates a condition where transistor 334 is at a very high resistance, thus beginning the charging of capacitor 320. As such, the time constant created by resistor 326 and capacitor 318, and the gate delays of inverters 330 and 332, delay the start of charging capacitor 320.

When capacitor 320 reaches the trigger level of inverter 336, the output of the inverter 336 goes low. The feedback transistor 338 pulls the voltage 340 high at a faster rate to avoid large shoot-through current in inverter 336 while the voltage of capacitor 320 continues to rise. Transistor 338 thus pulls the output of inverter 336 low and after a gate delay, pulls the output of inverter 342 high. The output 344 is the POS signal. A delayed POS signal 348 is also needed. Both POS signal and the delayed POS signal are required for the automatic mode-setting system 100. The delayed POS signal is generated as described hereinbelow.

Once signal 344 is high, signal 349 goes low, and, after a gate delay, the output of inverter 350 goes high. Transistor 352 behaves as a resistor, which begins charging capacitor 322. Transistor 354 operates similar to transistor 338, and inverters 356 and 358 operate similar to inverters 336 and 342, respectively, to generate delayed POS signal 348.

The generation of signals 344 and 348 depend on the rise time of the power supply voltage 206. If the power supply voltage 206 has a fast rise time, e.g., lower than 1 microsecond as an example (RC time constant of resistor 326 and capacitor 318), the output of inverter 332 rises to the power supply 206 rail after the power supply 206 has already settled to its maximum value, which means that the resistance given by transistor 206, and transistor 352, are not modulated by the gate voltage. But if the power supply 206 has a low rise time, e.g., higher than 1 microsecond, the resistance created by transistors 206 and 352 are much larger, because they are modulated by the power supply 206, and therefore the time constants for the RC circuits of transistor 206 and capacitor 320, along with transistor 352 and capacitor 322, are larger.

Conclusion

In summary, a device in accordance with the present invention discloses an automatic mode setting and power ramp compensator for system power on conditions. Although described with respect to a GPS receiver herein, the circuitry of the present invention is useful on other types of circuitry without departing from the scope of the present invention.

A mode-setting device in accordance with the present invention comprises a plurality of test points, coupled to circuitry within the GPS receiver, wherein the test points are used to test intermediate stages of output of the GPS receiver, a plurality of circuit components, each circuit component coupled to a corresponding test point in a respective manner, wherein the circuit components create outputs used in initialization of the GPS receiver, and a switch network, coupled between the circuitry in the GPS receiver and the plurality of test points, for selectively switching the plurality of test points from being used to test intermediate stages of output of the GPS receiver and creating outputs used in initialization.

Such a device optionally further includes the circuit components being resistors, the outputs used in initialization being logic level outputs, the logic level outputs being used to select a mode of the GPS receiver during power up of the GPS receiver, the selective switching of the test points is based on a presence of a Power On Signal (POS), and further based on a presence of an enable signal.

A Power On Signal (POS) generating device in accordance with the present invention comprises a switch network, comprising a plurality of transistors, and a plurality of capacitors, coupled to the switch network, wherein the switch network selectively charges each capacitor in a predetermined manner, wherein the predetermined manner is selected based on a quality of a power supply used to power up the circuit and POS signal is generated after the power supply has settled at a desired voltage value.

Such a device further optionally includes the device being used in a Global Positioning System (GPS) receiver, the POS device further generating a delayed POS signal, the device uses a fractional part of the power supply output to begin generation of the POS signal and the delayed POS signal, a mode-setting device for initializing the GPS receiver, the mode-setting device comprising a plurality of test points, coupled to circuitry within the GPS receiver, wherein the test points are used to test intermediate stages of output of the GPS receiver; a plurality of circuit components, each circuit component coupled to a corresponding test point in a respective manner, wherein the circuit components create outputs used in initialization of the GPS receiver; and a second switch network, coupled between the circuitry in the GPS receiver and the plurality of test points, for selectively switching the plurality of test points from being used to test intermediate stages of output of the GPS receiver and creating outputs used in initialization, and the POS device being resident on the GPS receiver chip.

A GPS receiver with mode-setting and power ramping circuitry in accordance with the present invention comprises a first switch network, comprising a plurality of transistors, a first plurality of circuit components, coupled to the first switch network, wherein the switch network selects paths through the circuit components to generate a Power On Signal (POS) and ramp power to the GPS receiver, a plurality of test points, coupled to circuitry within the GPS receiver, wherein the test points are used to test intermediate stages of output of the GPS receiver, a second plurality of circuit components, each circuit component coupled to a corresponding test point in a respective manner, wherein the circuit components create outputs used in initialization of the GPS receiver, and a second switch network, coupled between the circuitry in the GPS receiver and the plurality of test points, for selectively switching the plurality of test points from being used to test intermediate stages of output of the GPS receiver and creating outputs used in initialization.

Such a GPS receiver further optionally includes the first plurality of circuit components being a plurality of capacitors, and the second plurality of circuit components being a plurality of resistors.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the equivalents thereof.

What is claimed is:

1. A mode-setting device for initializing a GPS receiver in a preferred state, comprising:
   a plurality of test points, coupled to circuitry within the GPS receiver, wherein the test points are used to test intermediate stages of output of the GPS receiver;
   a plurality of circuit components, each circuit component coupled to a corresponding test point in a respective manner, wherein the circuit components create outputs used in initialization of the GPS receiver; and
   a switch network, coupled between the circuitry in the GPS receiver and the plurality of test points, for selectively switching the plurality of test points from being used to test intermediate stages of output of the GPS receiver and creating outputs used in initialization.

2. The mode-setting device of claim 1, wherein the circuit components are resistors.

3. The mode-setting device of claim 2, wherein the outputs used in initialization are logic level outputs.

4. The mode-setting device of claim 3, wherein the logic level outputs are used to select a mode of the GPS receiver during power up of the GPS receiver.

5. The mode-setting device of claim 4, wherein the selective switching of the test points is based on a presence of a Power On Signal (POS).

6. The mode-setting device of claim 5, wherein the selective switching of the test points is further based on a presence of an enable signal.

7. A Power On Signal (POS) generating device for ramping up power to a circuit during a power up state, comprising:
   a switch network, comprising a plurality of transistors;
   a plurality of capacitors, coupled to the switch network, wherein the switch network selectively charges each capacitor in a predetermined manner, wherein the predetermined manner is selected based on a quality of a power supply used to power up the circuit and a POS signal is generated after a power supply output has reached a desired voltage value, wherein the POS generating device uses a fractional part of the power supply output and a base-emitter voltage to begin generation of the POS signal and a delayed POS signal.

8. The POS device of claim 7, wherein the device is used in a Global Positioning System (GPS) receiver.

9. The POS device of claim 8, further comprising a mode-setting device for initializing the GPS receiver.

10. The POS device of claim 9, wherein the mode-setting device comprises a plurality of test points, coupled to circuitry within the GPS receiver, wherein the test points are used to test intermediate stages of output of the GPS receiver; a plurality of circuit components, each circuit component coupled to a corresponding test point in a respective manner, wherein the circuit components create outputs used in initialization of the GPS receiver; and a second switch network, coupled between the circuitry in the GPS receiver and the plurality of test points, for selectively switching the plurality of test points from being used to test intermediate stages of output of the GPS receiver and creating outputs used in initialization.

11. The POS device of claim 10, wherein the POS device is resident on the GPS receiver chip.

12. A GPS receiver with initial mode-setting and power ramping circuitry, comprising:

a first switch network, comprising a plurality of transistors;

a first plurality of circuit components, coupled to the first switch network, wherein the switch network selects paths through the circuit components to generate a Power On Signal (POS) and ramp power to the GPS receiver;

a plurality of rest points, coupled to circuitry within the GPS receiver, wherein the test points are used to test intermediate stages of output of the GPS receiver;

a second plurality of circuit components, each circuit component coupled to a corresponding test point in a respective manner, wherein the circuit components create outputs used in initialization of the GPS receiver; and a second switch network, coupled between the circuitry in the GPS receiver and the plurality of test points, for selectively switching the plurality of test points from being used to test intermediate stages of output of the GPS receiver and creating outputs used in initialization.

13. The GPS receiver of claim 12, wherein the first plurality of circuit components is a plurality of capacitors.

14. The GPS receiver of claim 13, wherein the second plurality of circuit components is a plurality of resistors.

* * * * *